United States Patent
Zekeriya et al.

(10) Patent No.: US 6,607,962 B2
(45) Date of Patent: Aug. 19, 2003

(54) GLOBALLY PLANARIZED BACKEND COMPATIBLE THIN FILM RESISTOR CONTACT/INTERCONNECT PROCESS

(75) Inventors: Viktor Zekeriya, Atherton, CA (US); Khanh Tran, Milpitas, CA (US)

(73) Assignee: Maxim Integrated Products, Inc., Sunnyvale, CA (US)

(*) Notice: Subject to any disclaimer, the term of this patent is extended or adjusted under 35 U.S.C. 154(b) by 0 days.

(21) Appl. No.: 09/925,945

(22) Filed: Aug. 9, 2001

(65) Prior Publication Data

US 2003/0030107 A1 Feb. 13, 2003

(51) Int. Cl.[7] .......................... H01L 21/20; H01L 21/44
(52) U.S. Cl. .................... 438/384; 438/382; 438/597; 438/672; 438/675
(58) Field of Search ................... 438/384, 600, 438/622, 623, 638, 627, 643, 382; 338/309, 312

(56) References Cited

U.S. PATENT DOCUMENTS

| | | | | |
|---|---|---|---|---|
| 4,975,386 A | * | 12/1990 | Rao | 438/384 |
| 5,420,063 A | * | 5/1995 | Maghsoudnia et al. | 438/384 |
| 5,547,896 A | * | 8/1996 | Linn et al. | 438/384 |
| 5,675,310 A | * | 10/1997 | Wojnarowski et al. | 29/621 |
| 5,736,458 A | * | 4/1998 | Teng | 438/627 |
| 6,090,678 A | * | 7/2000 | Maghsoudnia | 438/238 |
| 6,225,183 B1 | * | 5/2001 | Lee | 438/384 |
| 6,235,628 B1 | * | 5/2001 | Wang et al. | 438/622 |
| 6,245,663 B1 | * | 6/2001 | Zhao et al. | 438/600 |

OTHER PUBLICATIONS

Wolf, Stanley, et al.; Silicon Processing for the VLSI Era (2000), Lattice Press, Second Edition, vol. 1, p. 501.*

* cited by examiner

Primary Examiner—Wael Fahmy
Assistant Examiner—David L. Hogans
(74) Attorney, Agent, or Firm—Blakely, Sokoloff, Taylor & Zafman LLP

(57) ABSTRACT

A method of forming a thin film resistor contact incorporates an etch-stop material to protect the underlying thin film resistor from a subsequent dry etching process to form a contact opening to the thin film resistor. More specifically, the method includes forming a thin film resistor, forming a first dielectric layer over the thin film resistor, forming a first opening through the first dielectric layer to expose an underlying portion of the thin film resistor, forming an etch-stop within the first opening of the first dielectric layer, forming a second dielectric layer over the etch-stop and the first dielectric layer, forming a second opening through the second dielectric layer to expose the underlying portion of the etch-stop, and forming a metal plug within the second contact opening, wherein the metal plug is in electrical contact with the thin film resistor by way of the etch-stop. Alternatively, in the case of an insulating etch-stop, the second opening through the dielectric layer is through the etch-stop, and forming a metal plug within the second contact opening, wherein the metal plug is in direct electrical contact with the thin film resistor.

20 Claims, 7 Drawing Sheets

GLOBALLY PLANARIZED BACKEND COMPATIBLE THIN FILM RESISTOR CONTACT/INTERCONNECT PROCESS

FIELD OF THE INVENTION

This invention relates generally to semiconductor processing, and in particular, to a method of forming a thin film resistor contact.

BACKGROUND OF THE INVENTION

Thin film resistors are employed in many integrated circuits. Thin film resistors are used in integrated circuits to implement the desired functionality of the circuit, including biasing of active devices, serving as voltage dividers, assisting in impedance matching, etc. They are typically formed by deposition of a resistive material on a dielectric layer, and subsequently patterned to a desired size and shape. Often, a thin film resistor is subjected to a heat treatment process (i.e. annealing) to improve its stability and to bring the resistance to a desired value.

Generally, after all the thin film resistors and other components of an integrated circuit are formed, a dielectric layer is deposited to insulate the resistors and other components from the interconnect wiring. This dielectric layer may be subjected to planarization by chemical-mechanical polishing (CMP) if reduced topography is desired before forming the interconnect wiring. Once the dielectric layer is formed, contacts are made through the layer to make electrical connections to thin film resistors and other components of the integrated circuit.

To minimize any perturbation to the thin film resistors, these contacts need to be etched with a process that is highly selective to the thin film resistor material. Under this requirement, an optimal wet etch process is more readily achievable than a dry etch process and hence preferred. Once the contact openings are made, a metal plug process could be used to establish the electrical contact between the thin film resistor and the subsequent interconnect wiring. The metal plug process could be done with deposition of a barrier metal stack followed by tungsten, aluminum, and/or copper deposition. In a planarized backend process where the dielectric above the thin film is polished to achieve flatness, the preferred method for the metal plug process further involves polishing or etch-back of the metal-plug material following its deposition.

A problem with forming contacts to thin film resistors arises from the fact that the dielectric above the thin film resistors has a thickness variation stemming from natural process and process equipment variations. If this dielectric is polished, as described above, this thickness variation is further exacerbated due to the additional variation produced by the polish process. Thus, the thin film resistors across a wafer or from wafer-to-wafer can be at different depths below the top surface of the dielectric layer.

Because of the different depths of the thin film resistors, the etching of the contact openings has to be conducted in a manner that guarantees contact opening to the deepest thin film resistor and/or component. As a consequence, the contact openings for shallower thin film resistors are overetched. As such, controlled dry etching may be more difficult to achieve since degradation and/or punch-through of the shallower thin film resistors is highly probable. In the case of wet etching, all thin film contacts are wider due to the isotropic nature of wet etching. Moreover, the shallower thin film resistor contacts would be further enlarged because of overetching. When metal plugs are used following the formation of wet-etched contacts, the wide contact openings lead to incomplete fill. Furthermore, when tungsten is used as the plug material, poor plug adhesion due to stress and excessive removal of the plug due to tungsten polish could result.

To circumvent the above problem, the dielectric below the thin film resistors could be planarized by chemical-mechanical polishing prior to depositing and patterning the thin film resistors. Consequently, topography created by other components of an integrated circuit are globally planarized. As the addition of thin film resistors typically adds little topography, this method obviates the need for planarization of the dielectric deposited above thin film resistors. But while it reduces the problem of dielectric non-uniformity above the thin film resistors, the increase in dielectric non-uniformity below the thin film resistors makes it difficult to employ laser-trimming of individual resistors when high precision resistance values are required. This is because the dielectric thickness below the thin film resistors modulates the laser irradiation requirements for trimming.

Thus, there is a need for a method of forming a thin film resistor contact which eliminates or reduces the drawbacks associated with the prior art method of forming thin film resistor contacts. Such a method and resulting contact is disclosed herein in accordance with the invention.

SUMMARY OF THE INVENTION

An aspect of the invention relates to a new and improved method of forming a thin film resistor contact. With this new and improved method, the above issues associated with dry or wet etching of the contact openings to thin film are eliminated. Also, with this new and improved method, the underlying thin film resistors are protected from the customary etching process used to make the contact openings. In summary, the new and improved method of forming a thin film resistor contact incorporates an etch-stop material to protect the underlying thin film resistor from a subsequent process of dry etching the contact opening to the thin film resistor. The dry etching of the contact openings allows more control over the size of the openings, which then makes metal plug processes more manufacturable and reliable.

More specifically, the method of forming a thin film resistor contact of the invention comprises the steps of forming a thin film resistor, forming a first dielectric layer over the thin film resistor, forming a first opening through the first dielectric layer to expose an underlying portion of the thin film resistor, forming an electrically conductive etch-stop within the first opening of the first dielectric layer, forming a second dielectric layer over the etch-stop and the first dielectric layer, forming a second opening through the second dielectric layer to expose the underlying portion of the etch-stop, and forming a metal plug within the second contact opening, wherein the metal plug is in electrical contact with the thin film resistor by way of the etch-stop.

Another method of forming a thin film resistor contact of the invention comprises the steps of forming a thin film resistor, forming a first dielectric layer over the thin film resistor, forming a first opening through the first dielectric layer to expose an underlying portion of the thin film resistor, forming an electrically conductive etch-stop within the first opening of the first dielectric layer and continuously over another region of the first dielectric layer that does not overlie the thin film resistor, forming a second dielectric layer over the etch-stop and the first dielectric layer, forming a second opening through the second dielectric layer to expose the underlying region of the etch-stop that is not situated over the thin film resistor, and forming a metal plug within the second contact opening, wherein the metal plug is in electrical contact with the thin film resistor by way of the etch-stop.

In the exemplary implementation of the above methods of forming a thin film resistor contact, the electrically conductive etch-stop can be comprised of a combination of titanium and titanium-nitride, or titanium-tungsten and titanium-tungsten-nitride, or other suitable material that is electrically conductive and relatively selective to dry etching processes.

Yet another alternative method of forming a thin film resistor contact of the invention comprises the steps of forming a thin film resistor, forming a first dielectric layer over the thin film resistor, forming a first opening through the first dielectric layer to expose an underlying portion of the thin film resistor, forming an electrically insulating etch-stop within the first opening of the first dielectric layer, forming a second dielectric layer over the etch-stop and the first dielectric layer, forming a second opening through the second dielectric layer to expose the underlying portion of the etch-stop, removing the etch-stop to expose the underlying thin film resistor, and forming a metal plug within the second contact opening, wherein the metal plug is in direct electrical contact with the thin film resistor.

Still another alternative method of forming a thin film resistor contact of the invention comprises forming a thin film resistor; forming an electrically insulating etch-stop layer over the thin film resistor; forming a dielectric layer over the etch-stop layer; forming a first opening through the dielectric layer to expose a first underlying region of the etch-stop layer; forming a second opening through the insulating etch-stop layer to expose a second underlying region of the thin film resistor; and forming a metal plug within the first and second openings, wherein the metal plug is in direct electrical contact with the thin film resistor.

In the exemplary implementation of the above alternative methods of forming a thin film resistor contact, the electrically insulating etch-stop can be comprised of a silicon oxynitride, silicon nitride, or other suitable material that is electrically insulating but is relatively selective to dry etching processes.

Other aspects of the invention relate to the resulting thin film resistor contact made by the method of the invention. Additionally, other aspects, features and techniques of the invention will become apparent to one skilled in the relevant art in view of the following detailed description of the invention.

DETAILED DESCRIPTION OF THE INVENTION

Figure 1:
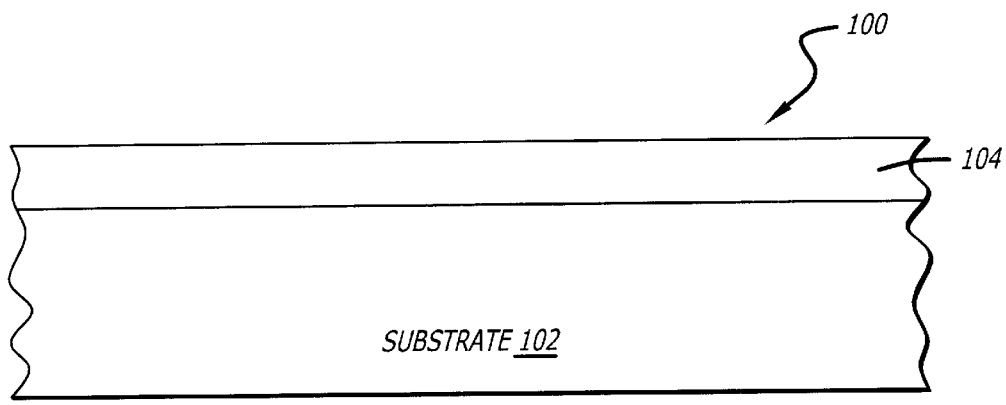
FIG. 1 illustrates a cross-sectional view of an exemplary semiconductor device at an initial stage of a method of forming a thin film resistor contact in accordance with the invention.

FIG. 1 illustrates a cross-sectional view of an exemplary semiconductor device 100 at an initial stage of a method of forming a thin film resistor contact in accordance with the invention. At this step, the semiconductor device 100 comprises a substrate 102 and a first dielectric layer (e.g. silicon dioxide ($SiO_2$)) 104 disposed over the substrate 102. The semiconductor device 100 at this initial stage is an example of what a semiconductor device may be comprised of prior to the formation of the thin film resistor and its contact in accordance with the invention. It shall be understood that the semiconductor device 100 at this stage may have a different appearance.

Figure 2:
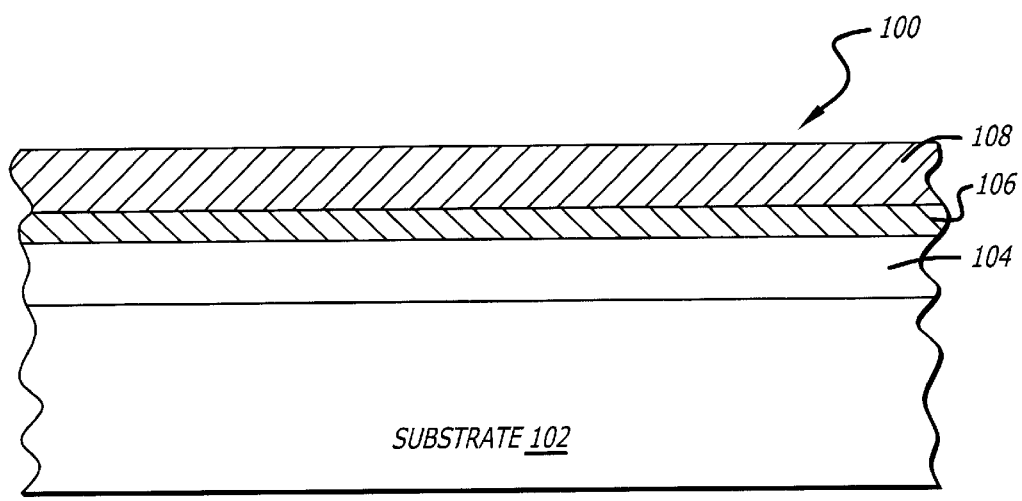
FIG. 2 illustrates a cross-sectional view of the exemplary semiconductor device at a subsequent step of the method of forming a thin film resistor contact in accordance with the invention.

FIG. 2 illustrates a cross-sectional view of the exemplary semiconductor device 100 at a subsequent step of the method of forming a thin film resistor contact in accordance with the invention. At this subsequent step, a layer of thin film resistor material 106 is formed over the first dielectric layer 104, and then a mask layer 108 is formed over the thin film resistor material 106. The thin film resistor material 106 may be comprised of silicon chromium (SiCr), nickel chromium (NiCr), tantalum nitride (TaN), and/or other suitable resistor materials.

Figure 3:
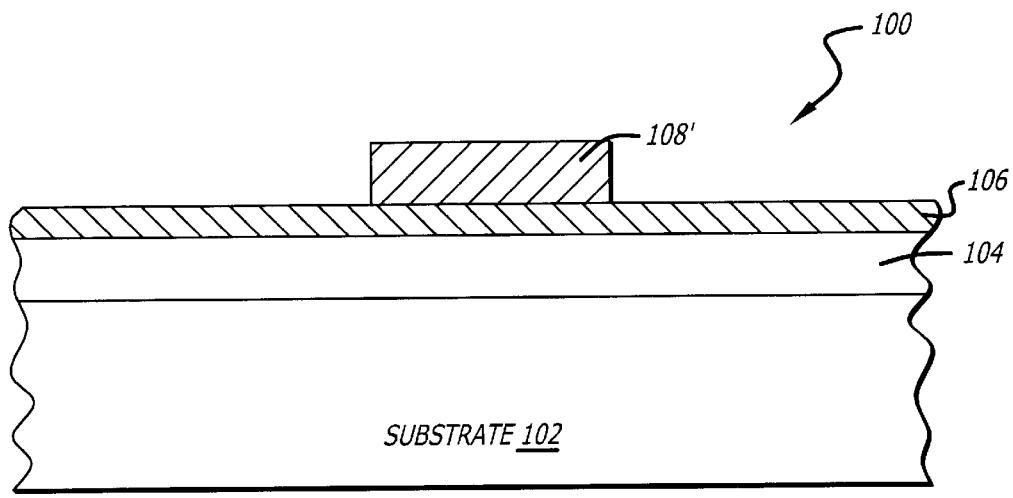
FIG. 3 illustrates a cross-sectional view of the exemplary semiconductor device at a subsequent step of the method of forming a thin film resistor contact in accordance with the invention.

FIG. 3 illustrates a cross-sectional view of the exemplary semiconductor device 100 at another subsequent step of the method of forming a thin film resistor contact in accordance with the invention. At this subsequent step, the mask layer 108 is developed and patterned to form a mask 108' that defines the underlying thin film resistor.

Figure 4:
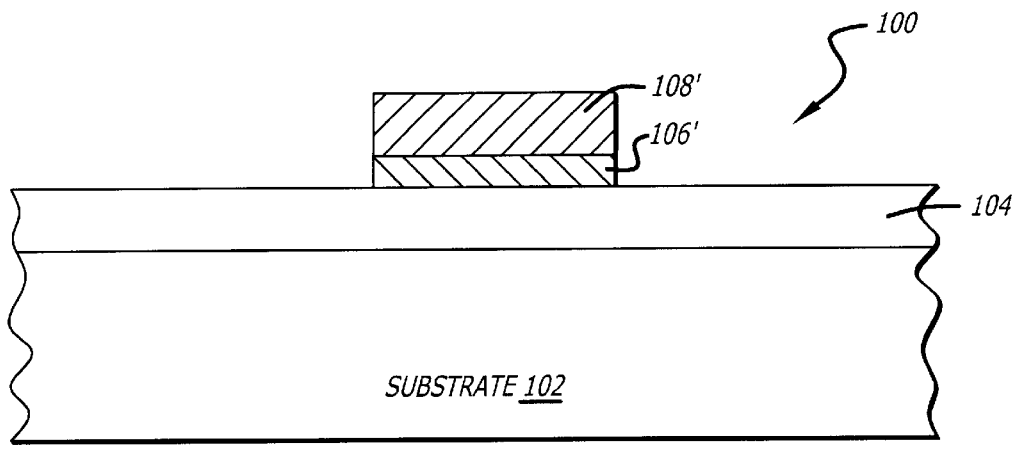
FIG. 4 illustrates a cross-sectional view of the exemplary semiconductor device at a subsequent step of the method of forming a thin film resistor contact in accordance with the invention.

FIG. 4 illustrates a cross-sectional view of the exemplary semiconductor device 100 at another subsequent step of the method of forming a thin film resistor contact in accordance with the invention. At this subsequent step, the thin film resistor material 106 is etched off except that portion which underlies the mask 108'. This forms a thin film resistor 106'. In this example, only the contact region of the thin film resistor 106' is shown in order to illustrate the method of forming a thin film resistor contact in accordance with the invention. The thin film resistor material 106 may be etched using anisotropic or isotropic etching techniques.

Figure 5:
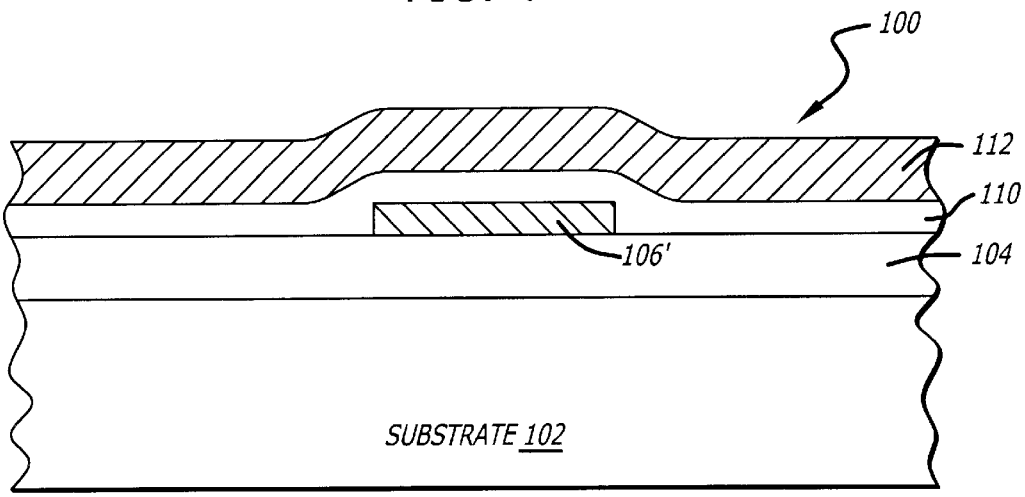
FIG. 5 illustrates a cross-sectional view of the exemplary semiconductor device at a subsequent step of the method of forming a thin film resistor contact in accordance with the invention.

FIG. 5 illustrates a cross-sectional view of the exemplary semiconductor device 100 at another subsequent step of the method of forming a thin film resistor contact in accordance with the invention. At this subsequent step, the mask 108' is removed. Then, a second dielectric layer (e.g. a layer of silicon dioxide ($SiO_2$)) 110 is formed over the thin film resistor 106' and over the exposed portion of the first dielectric layer 104. And, a mask layer 112 is formed over the second dielectric layer 110. In the exemplary implementation of the method of the invention, the second dielectric layer 110 is deposited to a thickness ranging from about few hundred Angstroms to a few thousand Angstroms. The mask layer 112 may be a photo resist or other material that can serve as a mask layer.

Figure 6:
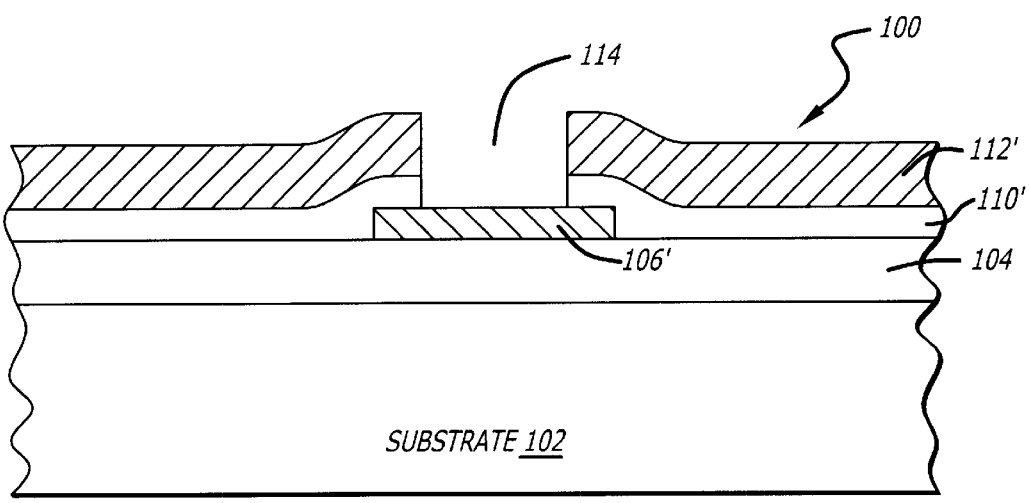
FIG. 6 illustrates a cross-sectional view of the exemplary semiconductor device at a subsequent step of the method of forming a thin film resistor contact in accordance with the invention.

FIG. 6 illustrates a cross-sectional view of the exemplary semiconductor device 100 at another subsequent step of the method of forming a thin film resistor contact in accordance with the invention. At this subsequent step, the mask layer 112 is developed and patterned to form a mask 112' having an opening 114 that defines the underlying contact opening for the thin film resistor 106'. Then, the second dielectric layer 110 is etched off at a portion underlying the opening 114 of the mask 112' to form contact opening for the thin film resistor 106'. The removal of layer 110 at a portion underlying the opening 114 is preferably accomplished by wet-etching, though dry-etching may be available to one skilled in the relevant art. The remaining second dielectric layer 110' serves to passivate the thin film resistor 106' at the non-contacted portion of the resistor 106'.

Figure 7:
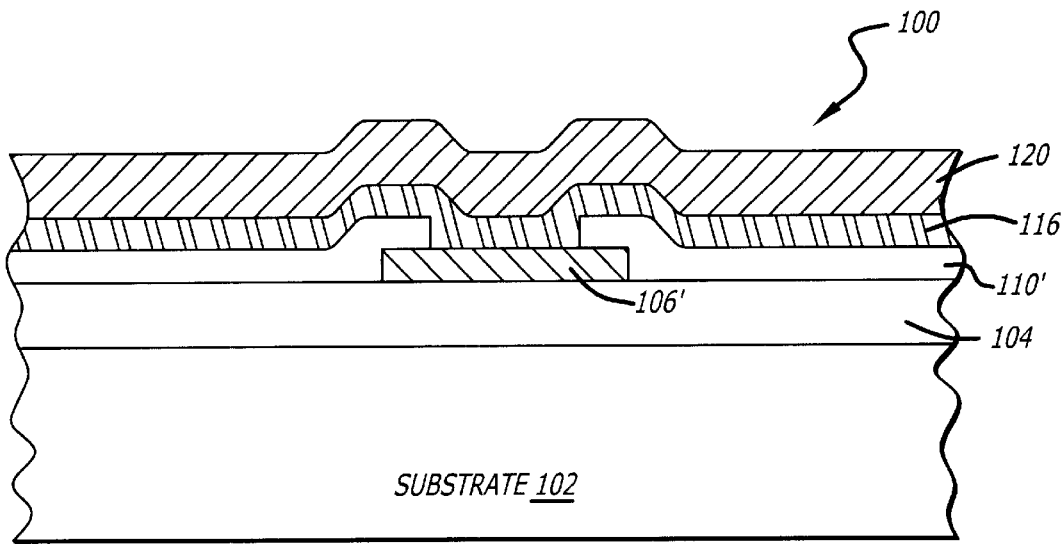
FIG. 7 illustrates a cross-sectional view of the exemplary semiconductor device at a subsequent step of the method of forming a thin film resistor contact in accordance with the invention.

FIG. 7 illustrates a cross-sectional view of the exemplary semiconductor device 100 at another subsequent step of the method of forming a thin film resistor contact in accordance with the invention. At this subsequent step, an etch-stop material layer 116 is formed over the portion of the thin film resistor 106' underlying the contact opening and over the remaining second dielectric layer 110'. Then, a mask layer 120 is formed over the etch-stop material layer 116. In the exemplary implementation of the method of the invention, the etch-stop material layer 116 may be comprised of an electrical conductor, such as titanium and titanium-nitride (Ti/TiN), and/or a titanium-tungsten (TiW) and titanium-tungsten-nitride (TiWN), or any other electrically conductive material that is selective to a subsequent dry etching process. Alternatively, the etch-stop material layer may be comprised of an electrical insulator, such as silicon oxynitride, silicon nitride, or other suitable material that is electrically insulating and relatively selective to dry etching processes. The mask layer 120 may be a photo resist or other material that can serve as a mask layer.

Figure 8:
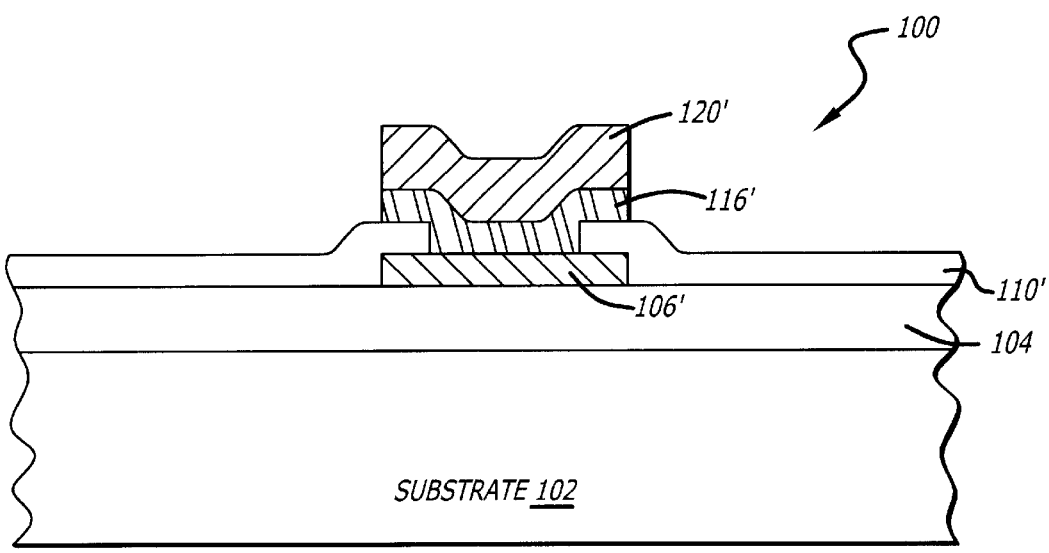
FIG. 8 illustrates a cross-sectional view of the exemplary semiconductor device at a subsequent step of the method of forming a thin film resistor contact in accordance with the invention.

FIG. 8 illustrates a cross-sectional view of the exemplary semiconductor device 100 at another subsequent step of the method of forming a thin film resistor contact in accordance with the invention. At this subsequent step, the mask layer 120 is developed and patterned to form a mask 120' which defines the underlying etch-stop region of the etch-stop material layer 116. Then, the etch-stop material layer 116 is etched off except that portion underlying the mask 120'. This forms an etch-stop 116' disposed over the thin film resistor 106' within the contact opening of the second dielectric layer 110' and also above the region of the second dielectric layer 110' proximate the contact opening. In the exemplary implementation of the method of the invention, the etching of the etch-stop material layer 116 can be performed by anisotropic or isotropic etching techniques.

Figure 9:
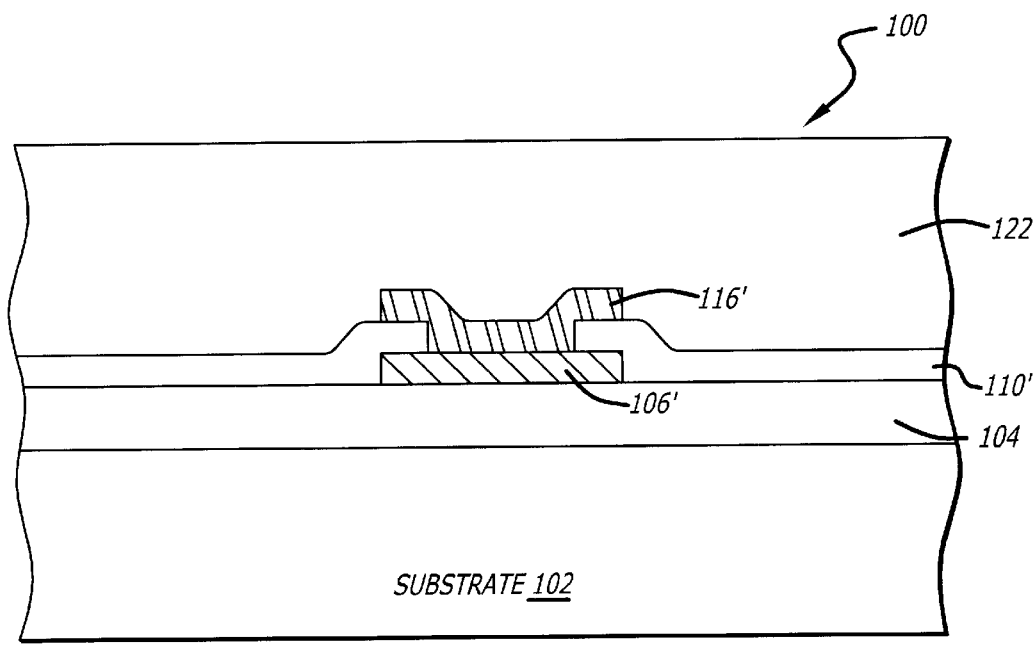
FIG. 9 illustrates a cross-sectional view of the exemplary semiconductor device at a subsequent step of the method of forming a thin film resistor contact in accordance with the invention.

FIG. 9 illustrates a cross-sectional view of the exemplary semiconductor device 100 at another subsequent step of the method of forming a thin film resistor contact in accordance with the invention. At this subsequent step, the mask 120' is stripped off. Then, a dielectric layer 122 is deposited over the etch-stop 116' and over the exposed portions of the second dielectric layer 110'. After the dielectric layer 122 has been deposited, it may be polished to achieve a desired planarization for its top surface and a desired thickness. In the exemplary implementation of the method of the invention, the dielectric layer 122 may be comprised of deposited silicon dioxide ($SiO_2$) and the polishing of the dielectric layer 122 may be performed by chemical mechanical polishing (CMP).

Figure 10:
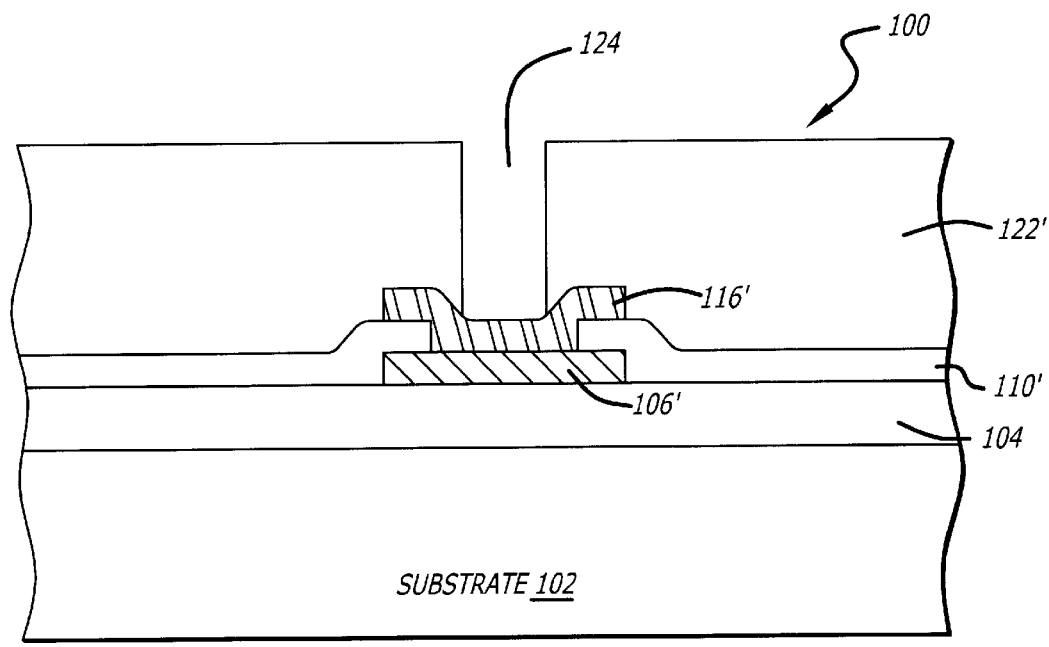
FIG. 10 illustrates a cross-sectional view of the exemplary semiconductor device at a subsequent step of the method of forming a thin film resistor contact in accordance with the invention.

FIG. 10 illustrates a cross-sectional view of the exemplary semiconductor device 100 at another subsequent step of the method of forming a thin film resistor contact in accordance with the invention. At this subsequent step, a contact opening 124 is formed through the dielectric layer 122 to expose the underlying etch-stop 116'. This step is performed by forming a mask layer (not shown) over the dielectric layer 122, developing and patterning the mask layer to form an opening above the to-be formed contact opening, and then dry etching the dielectric layer 122 through the opening of the mask to form the contact opening 124'. The remaining dielectric layer 122' serves to insulate the underlying structures of the semiconductor device 100 from the interconnect wiring to be formed over the dielectric layer 122'.

Figure 11A:
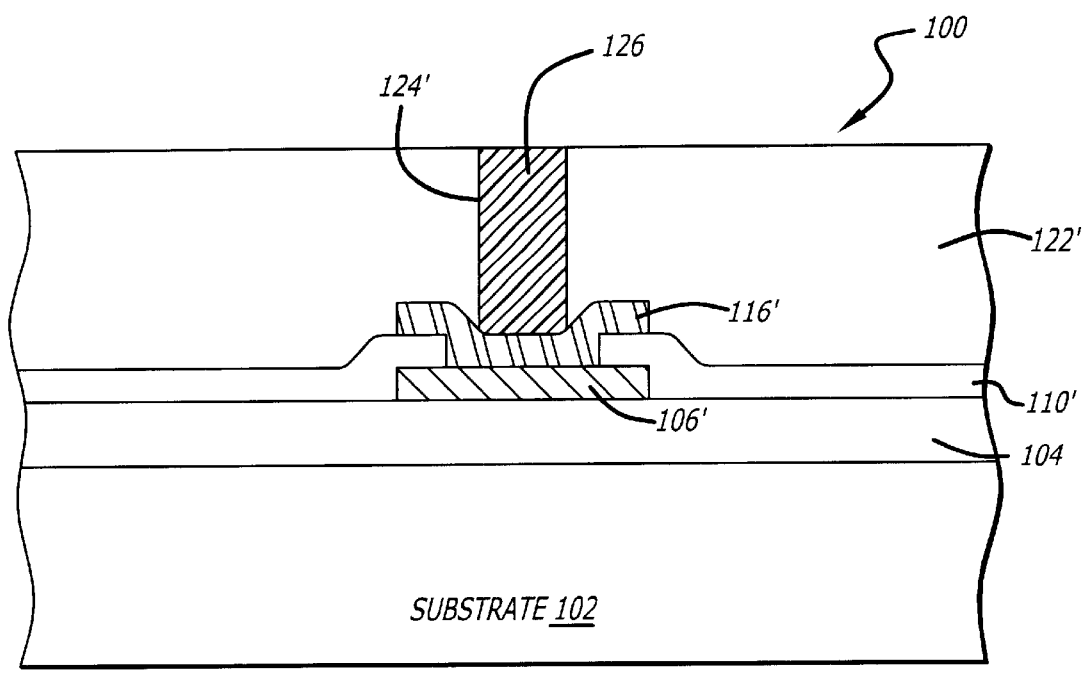
FIG. 11A illustrates a cross-sectional view of the exemplary semiconductor device at a subsequent step of the method of forming a thin film resistor contact in accordance with the invention.

FIG. 11A illustrates a cross-sectional view of the exemplary semiconductor device 100 at another subsequent step of the method of forming a thin film resistor contact in accordance with the invention. In this case, the etch-stop material 116' is electrically conductive. At this step, a metal plug 126 is formed within the contact opening 124' of the dielectric layer 122'. In the exemplary implementation of the method of the invention, the metal plug 126 is formed by sequentially depositing a barrier layer (Ti/TiN) and tungsten (W) to fill the contact opening 124'. Then, the tungsten material is etched or polished back to remove the tungsten (W) off the top surface of the dielectric layer 122'. The tungsten plug 126 makes electrical contact to the thin film resistor 106' by way of the electrically conductive etch-stop 116'.

Figure 11B:
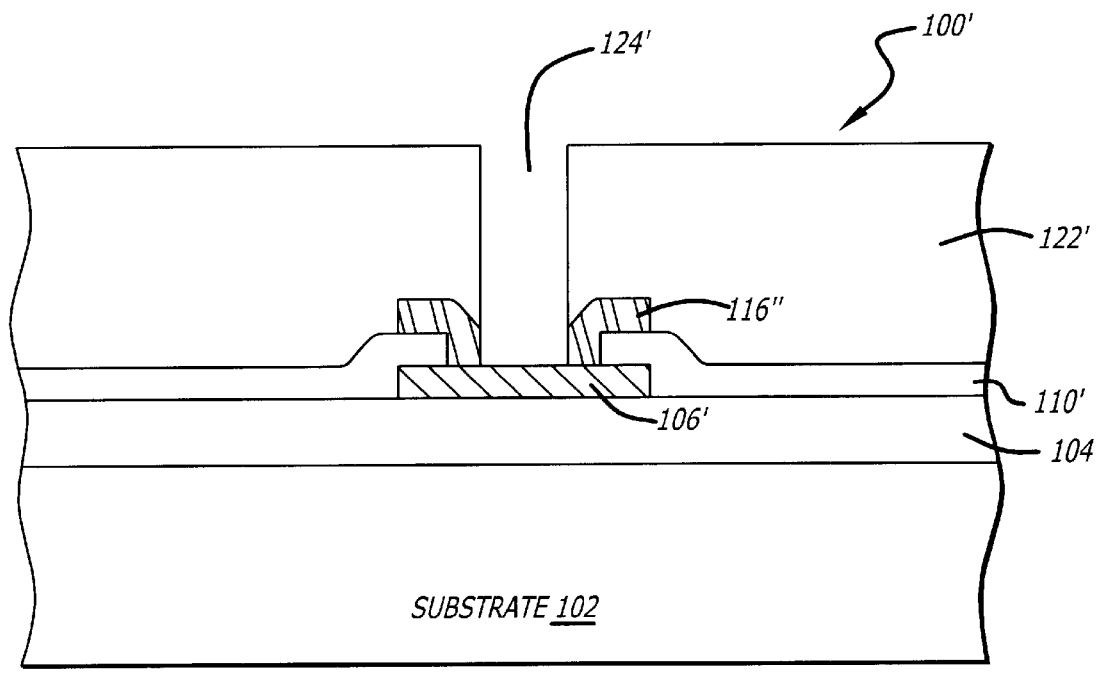
FIG. 11B illustrates a cross-sectional view of the exemplary semiconductor device at a subsequent step of an alternative method of forming a thin film resistor contact in accordance with the invention.

FIG. 11B illustrates a cross-sectional view of an exemplary semiconductor device 100' at another step (subsequent to the device shown in FIG. 10) of a first alternative method of forming a thin film resistor contact in accordance with the invention. In this case, the etch-stop material 116" is electrically insulating. At this step, the contact opening 124' is partially formed by etching of the dielectric layer 122' using a process that is selective to the etch-stop material 116". Subsequently, the portion of the etch-stop material 116" that underlies the contact opening 124' is removed using a process that is selective to the thin film resistor 106'. This process could result in an etch-stop spacer 116" being formed around the perimeter of the contact opening.

Figure 12:
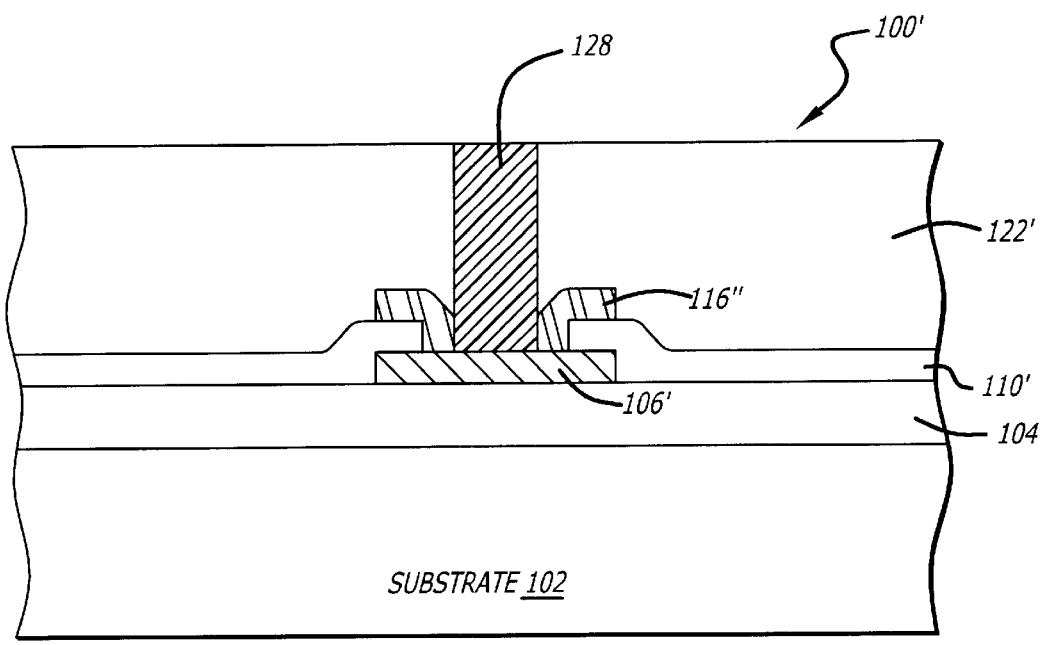
FIG. 12 illustrates a cross-sectional view of an exemplary semiconductor device at a step of a first alternative method of forming a thin film resistor contact in accordance with the invention.

FIG. 12 illustrates a cross-sectional view of the exemplary semiconductor device 100' at another subsequent step of the first alternative method of forming a thin film resistor contact in accordance with the invention. At this step, a metal plug 128 is formed within the contact opening 124' of the dielectric layer 122'. In the exemplary implementation of the method of the invention, the metal plug 128 is formed by sequentially depositing a barrier layer (Ti/TiN) and tungsten (W) to fill the contact opening 124'. Then, the tungsten material is etched or polished back to remove the tungsten (W) off the top surface of the dielectric layer 122'. The tungsten plug 128 makes direct electrical contact to the thin film resistor 106', as opposed to an indirect electrical contact to the thin film resistor 106' as is the case when the etch-stop is electrically conductive.

Figure 13:
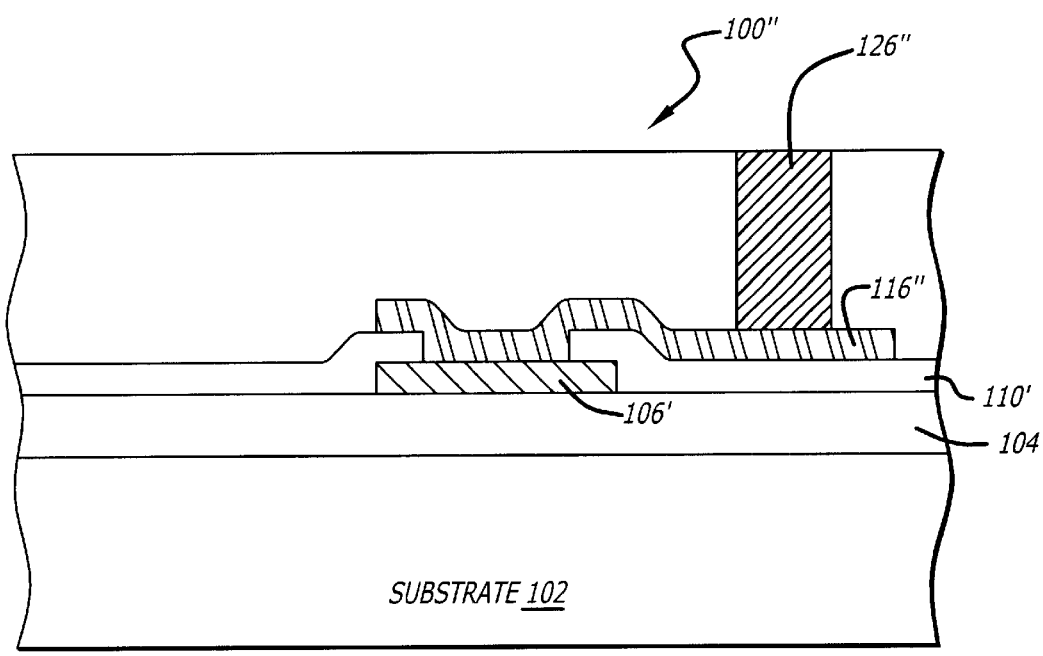
FIG. 13 illustrates a cross-sectional view of an exemplary semiconductor device at a step of a second alternative method of forming a thin film resistor contact in accordance with the invention.

FIG. 13 illustrates a cross-sectional view of an exemplary semiconductor device 100" at a step of a second alternative method of forming a thin film resistor contact in accordance with the invention. In this second alternative method, the electrically conductive etch-stop 116" was formed not only over the thin film resistor 106', but also continuously over a region that does not overlie the thin film resistor 106'. In this scenario, the electrical conductive etch-stop may also serve as a local interconnect to other nearby circuit components, subject to design considerations. Also in this second alternative method, the metal plug 126" was formed over the region of the etch-stop 116" that does not overlie the thin-film resistor 106'. Since in this case the etch-stop 116" is electrically conductive, the metal plug 126" makes electrical contact to the thin film resistor 106' by way of the etch-stop 116".

Figure 14:
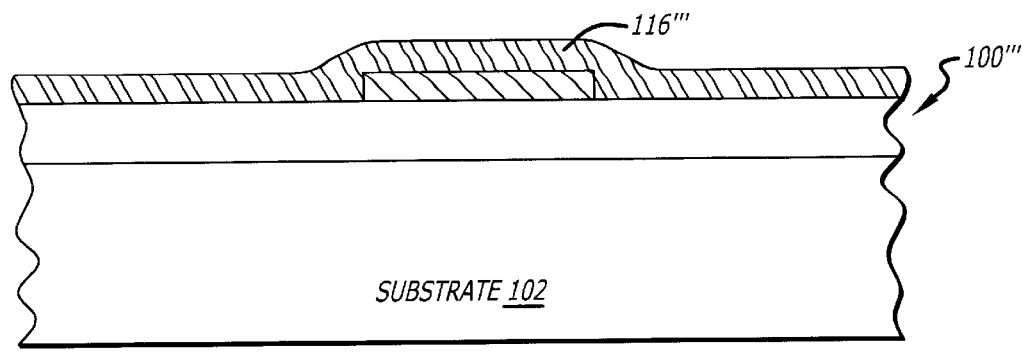
FIG. 14 illustrates a cross-sectional view of an exemplary semiconductor device at a step of a third alternative method of forming a thin film resistor contact in accordance with the invention.

FIG. 14 illustrates a cross-sectional view of an exemplary semiconductor device 100''' at a step of a third alternative method of forming a thin film resistor contact in accordance with the invention. In this third alternative method, an electrically insulating etch-stop 116''' is formed over the thin film resistor 106', instead of the second dielectric layer 110 as described in the previous methods of forming the thin film resistor contact.

Figure 15:
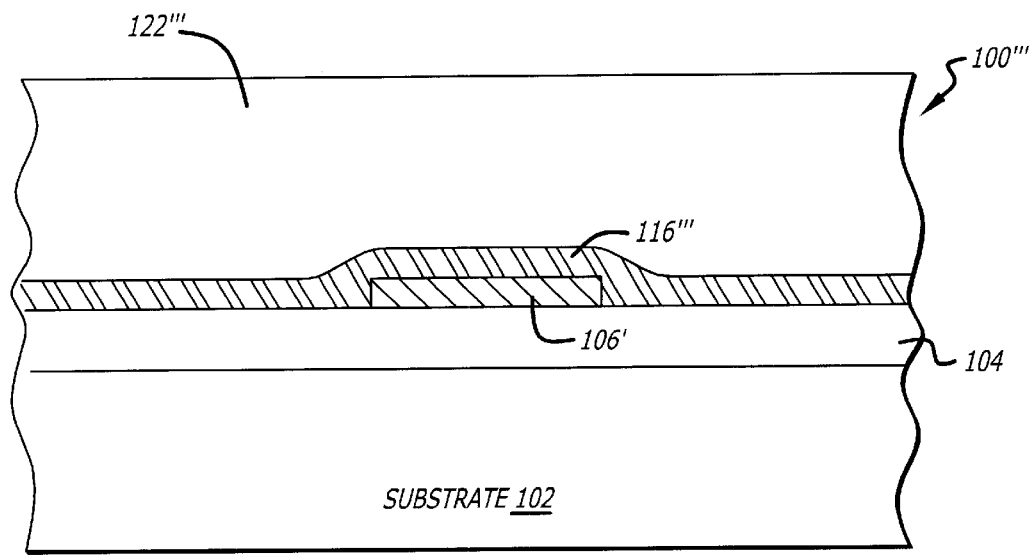
FIG. 15 illustrates a cross-sectional view of an exemplary semiconductor device at a subsequent step of a third alternative method of forming a thin film resistor contact in accordance with the invention.

FIG. 15 illustrates a cross-sectional view of an exemplary semiconductor device 100''' at a subsequent step of the third alternative method of forming a thin film resistor contact in accordance with the invention. In this subsequent step, the dielectric layer 122''' is deposited over the etch-stop layer 116'''.

Figure 16:
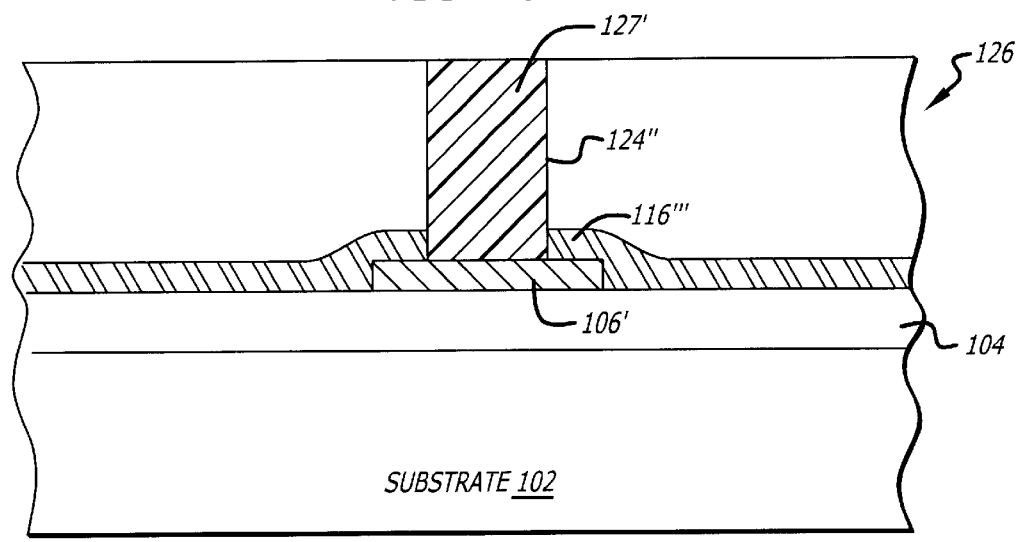
FIG. 16 illustrates a cross-sectional view of an exemplary semiconductor device after subsequent steps of a third alternative method of forming a thin film resistor contact in accordance with the invention.

FIG. 16 illustrates a cross-sectional view of an exemplary semiconductor device 100''' after subsequent steps of the third alternative method of forming a thin film resistor contact in accordance with the invention. In this case, a contact opening 124" is formed through the dielectric layer 122''' to expose the underlying etch-stop 116''' using an etching process that is selective to the etch-stop 116'''. Then, the contact opening 124" is extended through the etch-stop 116''' to expose the underlying thin film resistor 106' using an etching process that is selective to the thin film resistor 106'. Once the contact opening 124" is formed, a metal plug 128' is formed within the contact opening 124".

An advantage of the described methods of forming a thin film resistor contact of the invention is that the etch-stop allows the resistor contact opening to be formed by the same dry etching techniques that are used to open up the standard contacts to other components of an integrated circuit. This is because the etch stop protects the underlying thin film resistor from erosion which may otherwise occur from the dry etching if the etch-stop were not present. Since dry etching is typically anisotropic, the dry etching of the contact opening allows the opening 124' to be more uniform throughout the wafer and from wafer-to-wafer. The more controllable contact opening is particularly useful when tungsten (W) plugs are used, as it avoids a number of problems associated with overetched contact openings, such as incomplete fills, excessive removal of the plug due to dishing from the polish, and the peeling of the plugs due to high tensile stress of tungsten.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

It is claimed:

1. A method of forming a thin film resistor contact, comprising:
    forming a thin film resistor;
    forming a first dielectric layer over said thin film resistor;
    forming a first opening through said first dielectric layer to expose a first underlying portion of said thin film resistor;
    forming an electrically conductive etch-stop within said first opening of said first dielectric layer;
    forming a second dielectric layer over said etch-stop and said first dielectric layer;
    forming a second opening through said second dielectric layer to expose a second underlying portion of said etch-stop; and
    forming a metal plug within said second contact opening, wherein said metal plug is in electrical contact with said thin film resistor by way of said etch-stop.

2. The method of claim 1, wherein said first and second openings vertically overlap.

3. The method of claim 1, wherein said first and second openings do not vertically overlap.

4. The method of claim 1, wherein said thin film resistor comprises silicon chromium (SiCr).

5. The method of claim 1, wherein said thin film resistor comprises nickel chromium (NiCr).

6. The method of claim 1, wherein said thin film resistor comprises tantalum nitride (TaN).

7. The method of claim 1, wherein said etch-stop comprises titanium (Ti) and titanium-nitride (TiN).

8. The method of claim 1, wherein said etch-stop comprises titanium-tungsten (TiW) and titanium-tungsten-nitride (TiWN).

9. The method of claim 1, wherein forming said second opening through said second dielectric layer comprises dry etching said second dielectric layer to form said second opening.

10. The method of claim 1, wherein said metal plug comprises titanium and titanium nitride.

11. The method of claim 1, wherein said metal plug comprises tungsten.

12. A method of forming a thin film resistor contact, comprising:

forming a thin film resistor;

forming a first dielectric layer over said thin film resistor;

forming a first opening through said first dielectric layer to expose a first underlying portion of said thin film resistor;

forming an electrically insulating etch-stop within said first opening of said first dielectric layer;

forming a second dielectric layer over said etch-stop and said first dielectric layer;

forming a second opening through said second dielectric layer to expose a second underlying portion of said etch-stop;

removing said etch-stop underlying said second opening; and forming a metal plug within said second contact opening, wherein said metal plug is in direct electrical contact with said thin film resistor.

13. The method of claim 12, wherein said thin film resistor comprises silicon chromium (SiCr).

14. The method of claim 12, wherein said thin film resistor comprises nickel chromium (NiCr).

15. The method of claim 12, wherein said thin film resistor comprises tantalum nitride (TaN).

16. The method of claim 12, wherein said etch-stop comprises silicon oxynitride.

17. The method of claim 12, wherein said etch-stop comprises silicon nitride.

18. The method of claim 12, wherein forming said second opening through said second dielectric layer comprises dry etching said second dielectric layer to form said second opening.

19. The method of claim 12 wherein said metal plug comprises titanium and titanium nitride.

20. The method of claim 12, wherein said metal plug additionally comprises tungsten.

* * * * *